(12) United States Patent
Shih

(10) Patent No.: US 10,044,543 B2
(45) Date of Patent: Aug. 7, 2018

(54) REDUCING CREST FACTORS

(71) Applicant: Futurewei Technologies, Inc., Plano, TX (US)

(72) Inventor: Huei Yuan Shih, Murphy, TX (US)

(73) Assignee: Futurewei Technologies, Inc., Plano, TX (US)

( * ) Notice: Subject to any disclaimer, the term of this patent is extended or adjusted under 35 U.S.C. 154(b) by 0 days.

(21) Appl. No.: 14/814,157

(22) Filed: Jul. 30, 2015

(65) Prior Publication Data

US 2017/0033964 A1   Feb. 2, 2017

(51) Int. Cl.
*H04L 27/26* (2006.01)
*H04B 1/04* (2006.01)

(52) U.S. Cl.
CPC ........ *H04L 27/2623* (2013.01); *H04B 1/0475* (2013.01); *H04L 27/2614* (2013.01)

(58) Field of Classification Search
CPC ............. H04L 27/2623; H04L 27/2624; H04L 27/2614; H04B 2201/70706; H04B 1/0475
See application file for complete search history.

(56) References Cited

U.S. PATENT DOCUMENTS

| 7,349,817 | B2* | 3/2008 | Cha | H04L 27/2614 370/208 |
| 7,864,080 | B1* | 1/2011 | Demirsoy | H03H 17/0685 341/61 |
| 7,986,932 | B1* | 7/2011 | Zhang | H03H 17/06 455/126 |
| 8,164,491 | B2* | 4/2012 | Cho | H03M 7/3004 327/357 |
| 8,457,249 | B2* | 6/2013 | Gotman | H04L 27/2624 375/260 |
| 2006/0153321 | A1* | 7/2006 | Bhuvanagiri | H03H 17/0225 375/350 |
| 2007/0217543 | A1* | 9/2007 | Hamada | H04L 27/2624 375/296 |
| 2009/0316827 | A1* | 12/2009 | Ishikawa | H04L 27/2623 375/296 |
| 2011/0182339 | A1* | 7/2011 | Kang | H04L 27/2624 375/224 |

(Continued)

FOREIGN PATENT DOCUMENTS

JP   2004-260678   * 9/2004

OTHER PUBLICATIONS

Brown "Digital Signal Processing Lecture 6", Feb. 20, 2012, slides 1-28.*

(Continued)

*Primary Examiner* — Sophia Vlahos
(74) *Attorney, Agent, or Firm* — Wen-Jeng Vincent Lue

(57) ABSTRACT

The present disclosure describes methods, systems, and computer program products for a reducing crest factors. An input signal is received. The input signal includes a clipping signal that reduces a peak amplitude of a source signal based on a predetermined clipping level. The input signal is transposed to a plurality of transposed signals using a plurality of multipliers. A feedback signal is generated based on the plurality of transposed signals using a first plurality of delay taps. A windowing signal is generated based on the feedback signal. The windowing signal is used to reduce a crest factor of the source signal.

20 Claims, 7 Drawing Sheets

(56) References Cited

U.S. PATENT DOCUMENTS

2011/0255627 A1     10/2011  Gotman et al.
2011/0258244 A1*    10/2011  Kang .................. H04L 27/2624
                                                            708/207

OTHER PUBLICATIONS

XP055302155 Olli Johannes Vaananen,"Digital Modulators With Crest Factor Reduction Techniques", Helsinki University of Technology, dated Jan. 1, 2006, total 127 pages.

* cited by examiner

US 10,044,543 B2

REDUCING CREST FACTORS

BACKGROUND

This disclosure relates to data transmission in communication systems and, more specifically, to reducing crest factors. In a communication system, a crest factor of a signal may represent a ratio of peak values to the effective value of the signal. In some cases, a crest factor may be calculated by dividing the peak amplitude of a signal by the root mean square of the signal. Therefore, the crest factor may indicate the peak-to-average power ratio of the signal. A signal with a high crest factor may distort the linearity of a power amplifier in a transmitter. Therefore, in some cases, a transmitter may reduce the crest factor of a signal before transmitting the signal.

SUMMARY

The present disclosure is directed to methods and systems for reducing crest factors. The methods include receiving an input signal. The input signal includes a clipping signal that reduces a peak amplitude of a source signal based on a predetermined clipping level. The input signal is transposed to a plurality of transposed signals using a plurality of multipliers. A feedback signal is generated based on the plurality of transposed signals using a first plurality of delay taps. A windowing signal is generated based on the feedback signal. The windowing signal is used to reduce a crest factor of the source signal.

Other implementations of this aspect include corresponding user devices, apparatuses, computer-implemented methods, and computer programs recorded on one or more computer storage devices, each configured to perform the actions of the methods. A system of one or more computers can be configured to perform particular operations or actions by virtue of having software, firmware, hardware, or a combination of software, firmware, or hardware installed on the system that in operation causes the system to perform the actions. One or more computer programs can be configured to perform particular operations or actions by virtue of including instructions that, when executed by data processing apparatus, cause the apparatus to perform the actions.

The details of one or more implementations of the subject matter of this specification are set forth in the accompanying drawings and the description below. Other features, aspects, and advantages of the subject matter will be apparent from the description, the drawings, and/or the claims.

DESCRIPTION OF DRAWINGS

Like reference numbers and designations in the various drawings indicate like elements.

DETAILED DESCRIPTION

The following detailed description is presented to enable any person skilled in the art to make, use, and/or practice the disclosed subject matter, and is provided in the context of one or more particular implementations. Various modifications to the disclosed implementations will be readily apparent to those skilled in the art, and the general principles defined herein may be applied to other implementations and applications without departing from the scope of the disclosure. Thus, the present disclosure is not intended to be limited to the described and/or illustrated implementations but is to be accorded the widest scope consistent with the principles and features disclosed herein.

In some cases, a crest factor reduction (CFR) algorithm may be used to reduce the dynamic range of a signal that has a high Peak to Average Power Ratio (PAPR). Reducing the crest factor of a signal can improve the linearity of the radio frequency (RF) power amplifier in a transmitter. In some cases, multi-stage CFR algorithms can be used to reduce the PAPR of a transmission signal. However, a multi-stage CFR algorithm may use variable parameters for signals with different bandwidth.

In some cases, the window-based CFR algorithm may be used to reduce the peak amplitude of a transmission signal. The window-based CFR algorithm may use a finite impulse response (FIR) filter with fixed coefficients for signals with different bandwidth. The FIR filter may provide a one-stage reduction of the peak waveform of the signal. In some cases, the FIR filter may include a data-broadcasting structure and a folding structure to improve the speed performance of the filter. In some cases, the FIR filter may use canonic signed digit (CSD) arithmetic to further reduce implementation complexity and improve speed performance of the filter. FIGS. 1-10 and associated descriptions provide details of these implementations.

Figure 1:
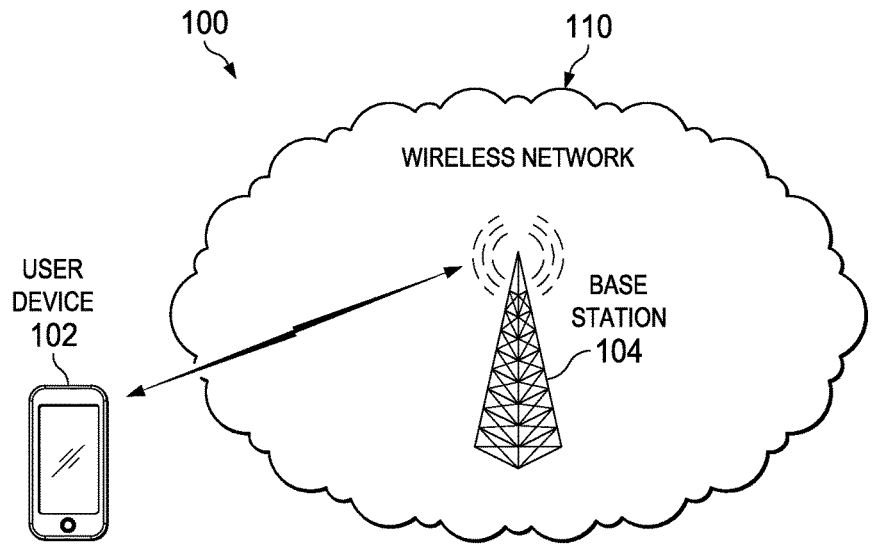
FIG. 1 is an example wireless communication system that reduces crest factors according to an implementation.

FIG. 1 is an example wireless communication system 100 that reduces crest factors according to an implementation. For example, an input signal may be received. The input signal may include a clipping signal that reduces a peak amplitude of a source signal based on a predetermined clipping level. The input signal may be transposed to a plurality of transposed signals using a plurality of multipliers. In some cases, each of the plurality of multipliers may have a windowing function coefficient, and each of the plurality of transposed signals may be generated by multiplying the input signal with the respective windowing function coefficient of each of the plurality of the multipliers. In some cases, at least one of the plurality of multipliers may be implemented using canonic signed digit arithmetic. In some cases, at least one of the plurality of multipliers may be implemented using a multiplication function unit. A feedback signal may be generated based on the plurality of transposed signals using a first plurality of delay taps. A windowing signal may be generated based on the feedback signal. The windowing signal may reduce a crest factor of the source signal. In some cases, a forward path signal may be generated using the plurality of transposed signals, the first plurality of delay taps, and a second plurality of delay taps. In some cases, the windowing signal may be generated based on the forward path signal. In some cases, an output signal may be generated based on the windowing signal and the source signal.

Reducing crest factors according to methods and systems described herein may provide one or more advantages. For example, transposing the signal before passing the signal through the delay taps may reduce the delay created in the critical path of the FIR filter. In addition, using a folding structure may reduce the number of multipliers in the FIR filter and therefore reduces implementation complexity of the filter. Furthermore, using CSD arithmetic may replace multiplication function units with addition and subtraction function units, and therefore reduces the delay and the implementation complexities of the filter. Reducing the delay may improve the speed performance of the FIR filter and enable the filter to be used to process a broadband signal that has a stringent delay requirement.

At a high level, the example wireless communication system 100 includes a user device 102 and a wireless communication network 110, which includes a base station 104 that is configured to communicate with the user device 102. In the illustrated example, the user device 102 may perform a CFR operation on an uplink signal before transmitting the uplink signal to the base station 104. Similarly, the base station 104 may perform a CFR operation on a downlink signal before transmitting the downlink signal to the user device 102.

For example, the user device 102 may include a windowing signal generator. A windowing signal generator may include one or more hardware circuit elements, software, or a combination thereof that can be configured to create a signal waveform with window shaping. The windowing signal generator may receive an input signal. The input signal may include a clipping signal that reduces a peak amplitude of a source signal based on a predetermined clipping level. In some case, the source signal may be a signal to be transmitted before reducing the crest factor. The input signal may be transposed to a plurality of transposed signals using a plurality of multipliers. A feedback signal may be generated based on the plurality of transposed signals using a first plurality of delay taps. A windowing signal may be generated based on the feedback signal. In some cases, the user device 102 may use the windowing signal and the input signal to generate an output signal. The output signal has a reduced crest factor. The user device 102 may transmit the output signal using a transmit antenna. FIGS. 2-10 and associated descriptions provide additional details of these implementations.

Similarly, the base station 104 may also include a windowing signal generator that generates a windowing signal as discussed above. The base station 104 may use the windowing signal and the input signal to generate an output signal that has a reduced crest factor. The base station 104 may transmit the output signal using a transmit antenna.

Turning to a general description of the elements, a user device may be referred to as a mobile electronic device, user device, mobile station, subscriber station, portable electronic device, mobile communications device, wireless modem, or wireless terminal. Examples of a UE (e.g., the UE 102) may include a cellular phone, personal data assistant (PDA), smart phone, laptop, tablet personal computer (PC), pager, portable computer, portable gaming device, wearable electronic device, or other mobile communications device having components for communicating voice or data via a wireless communication network. The wireless communication network may include a wireless link over at least one of a licensed spectrum and an unlicensed spectrum.

Other examples of a user device include mobile and fixed electronic devices. A UE may include a Mobile Equipment (ME) device and a removable memory module, such as a Universal Integrated Circuit Card (UICC) that includes a Subscriber Identity Module (SIM) application, a Universal Subscriber Identity Module (USIM) application, or a Removable User Identity Module (R-UIM) application. The term "user device" can also refer to any hardware or software component that can terminate a communication session for a user.

The wireless communication network 110 may include one or a plurality of radio access networks (RANs), core networks (CNs), and external networks. The RANs may comprise one or more radio access technologies. In some implementations, the radio access technologies may be Global System for Mobile communication (GSM), Interim Standard 95 (IS-95), Universal Mobile Telecommunications System (UMTS), CDMA2000 (Code Division Multiple Access), Evolved Universal Mobile Telecommunications System (UMTS), Long Term Evaluation (LTE), or LTE-Advanced. In some instances, the core networks may be evolved packet cores (EPCs).

A RAN is part of a wireless telecommunication system which implements a radio access technology, such as UMTS, CDMA2000, 3GPP LTE, and 3GPP LTE-A. In many applications, a RAN includes at least one base station 104. A base station 104 may be a radio base station that may control all or at least some radio-related functions in a fixed part of the system. The base station 104 may provide radio interface within their coverage area or a cell for the user device 102 to communicate. The base station 104 may be distributed throughout the cellular network to provide a wide area of coverage. The base station 104 directly communicates to one or a plurality of user devices, other base stations, and one or more core network nodes.

While described in terms of FIG. 1, the present disclosure is not limited to such an environment. The base station 104 may operate on any of the different wireless communication technologies. Example wireless technologies include Global System for Mobile Communication (GSM), Universal Mobile Telecommunications System (UMTS), 3GPP Long Term Evolution (LTE), LTE-Advanced (LTE-A), wireless broadband communication technologies, and others. Example wireless broadband communication systems include IEEE 802.11 wireless local area network, IEEE 802.16 WiMAX network, and others.

While elements of FIGS. 1-10 are shown as including various component parts, portions, or modules that implement the various features and functionality, nevertheless these elements may instead include a number of sub-modules, third-party services, components, libraries, and such, as appropriate. Furthermore, the features and functionality of various components can be combined into fewer components as appropriate.

Figure 2:
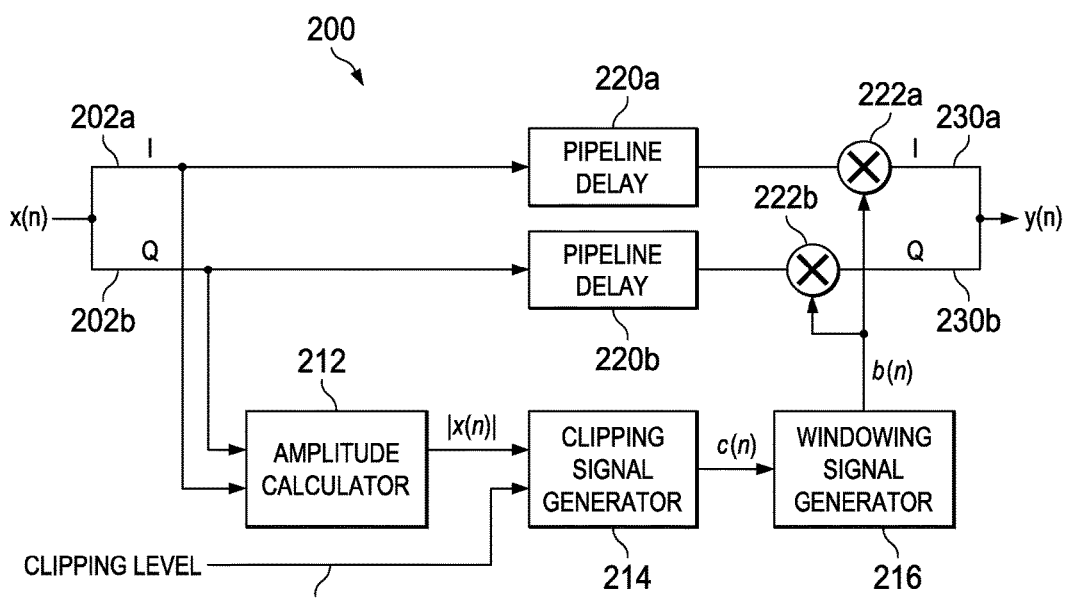
FIG. 2 is a schematic diagram illustrating an example crest factor reduction component according to an implementation.

FIG. 2 is a schematic diagram illustrating an example crest factor reduction component 200 according to an implementation. In some cases, the crest factor reduction component 200 can be used in a transmitter, e.g., in the user device 102 or in the base station 104, to reduce the peak amplitude of a source signal x(n). As illustrated, the crest factor reduction component 200 includes an amplitude calculator 212, a clipping signal generator 214, and a windowing signal generator 216. The amplitude calculator 212, the clipping signal generator 214, and the windowing signal generator 216 can be used to generate a windowing signal b(n) based on the source signal x(n) and a clipping level 210. The crest factor reduction component 200 also includes pipeline delay registers 220a-b and multipliers 222a-b that are used to mix the source signal x(n) with the windowing signal b(n) to generate an output signal y(n) that has a reduced crest factor.

In the illustrated example, the source signal x(n) includes an I component that is denoted as 202a and a Q component that is denoted as 202b As illustrated, the I and Q components of the source signal 202a-b pass through the amplitude calculator 212 to generate the amplitude level |x(n)| of the source signal x(n). In some cases, the amplitude calculator 212 may include one or more hardware circuit elements, software, or a combination thereof that can be configured to generate an amplitude level of a signal.

In some cases, the clipping signal generator 214 may include one or more hardware circuit elements, software, or a combination thereof that can be configured to generate a clipping signal. As illustrated, the clipping signal generator 214 receives the amplitude level |x(n)| and a clipping level 210 to generate a clipping signal c(n). In some cases, the clipping level 210 represents a predetermined peak value for the output signal y(n). In some cases, the clipping signal c(n) represents a scaling function, which may scale down the components in the source signal x(n) that are above the clipping level 210.

The following equation represents an example clipping signal c(n).

$$c(n) = \begin{cases} 1, & |x(n)| \leq \text{Clipping Level} \\ \frac{\text{Clipping Level}}{|x(n)|}, & |x(n)| > \text{Clipping Level} \end{cases}.$$

In some cases, for example, in a hard-clipping CFR algorithm, the source signal x(n) is multiplied with the clipping signal c(n) to generate an output signal. However, the output signal produced in the hard clipping CFR algorithm may include an increased out-of-band signal level. This may be referred to as adjacent channel power re-growth problems. Because the out-of-band signal level is increased, the noise floor of the output signal is degraded. In some cases, an output signal with increased out-of-band signal level may fail an out-of-band emission mask requirement specified by a radio access technology standard, and therefore cannot be transmitted in the corresponding wireless communication system.

In some cases, a windowing signal may be used to reduce the adjacent channel power re-growth effects. In some cases, as illustrated in FIG. 2, the windowing signal generator 216 may receive the clipping signal c(n) and generate the windowing signal b(n) based on the clipping signal c(n). In some cases, the windowing signal generator may be implemented using a FIR filter. The FIR filter may include N windowing function units. Each of the windowing function unit may have a windowing function coefficient. The windowing function coefficient may be denoted as $W_0$, $W_1$, $W_2$, ..., $W_{N-1}$, where N represents the order of the FIR filter. In some cases, the order of the FIR filter denotes the number of windowing function units used in the FIR filter. The following equation represents an example windowing signal b(n).

$$b(n) = 1 - \sum_{k=-\infty}^{\infty} [1 - c(n)]w(n-k)$$

As illustrated, the source signals 202a-b pass through pipeline delay registers 220a and 220b, and feed into the multipliers 222a-b, respectively. The multipliers 222a-b multiply the delayed source signals with a windowing signal b(n) to generate output signals 230a-b. The output signals 230a-b have a reduced crest factor compared to the source signals 202a-b. The following equation represents an example windowing signal y(n):

$$y(n)=x(n)b(n)$$

In some cases, the windowing-based CFR algorithm may lead to an over-reduction problem. For example, the peak amplitude of the output signal may be reduced too much. The output signal, therefore, may not be sufficient. Transmitting an insufficient signal may impact the system performance. To reduce the over-reduction problems, the windowing signal generator 216 may generate a feedback signal and generate the windowing signal b(n) based on the feedback signal. FIGS. 3-10 and associated descriptions provide additional details of using feedback signal in a windowing signal generator.

In some cases, the speed performance of the windowing signal generator 216 may impact the signal that the example CFR component 200 may process. For example, if an input signal has a sampling frequency $f_s$, then the sampling time of the input signal may be expressed as $T_s$, which is equal to $1/f_s$. Therefore, if the processing time of the windowing signal generator 216 is greater than $T_s$, then the CFR component 200 may not be used to process the input signal. Therefore, to process a broadband signal, which may have high sampling frequency and thus small sampling time, a high-speed windowing signal generator may be used.

Figure 7:
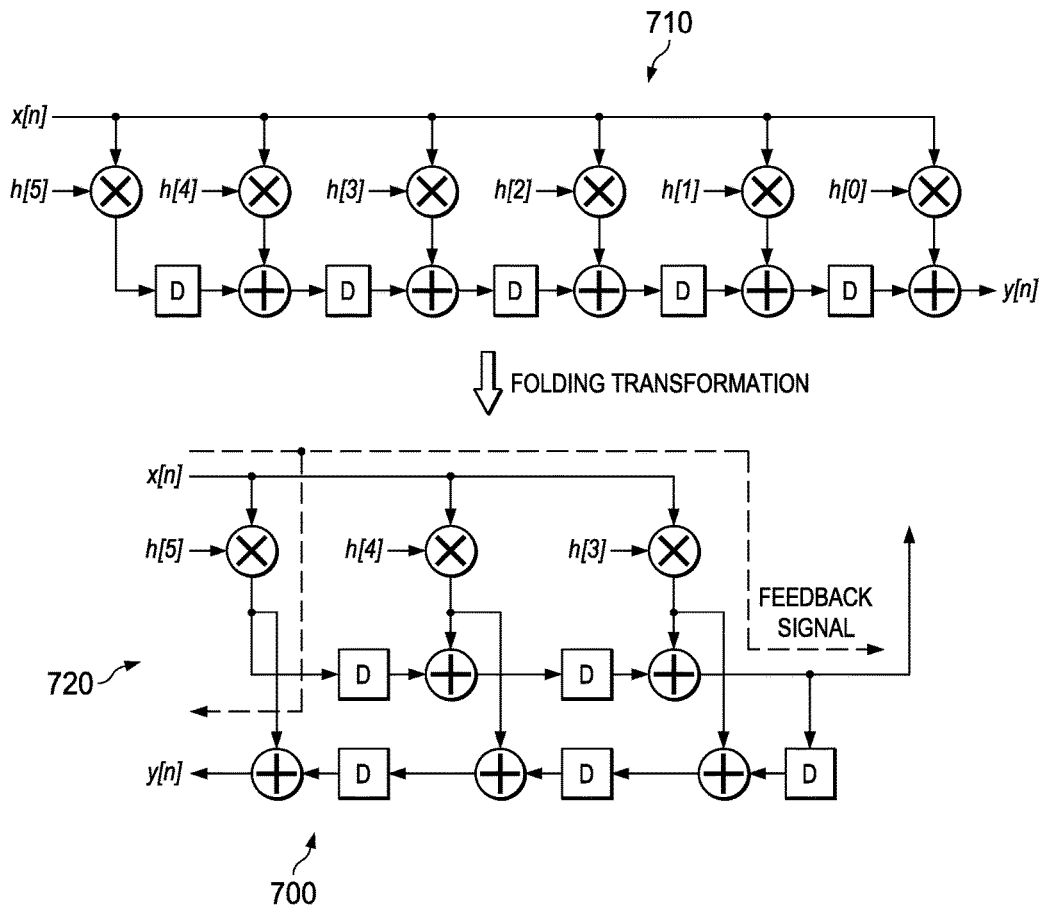
FIG. 7 is a schematic diagram illustrating a folding transformation according to an implementation.

In some cases, the windowing signal generator 216 may use a transposed structure to improve the speed performance. In some cases, the windowing signal generator 216 may also use a folding structure to reduce implementation complexity and further improve the speed performance. FIG. 7 and associated descriptions provide an example folding structure. In some cases, the windowing signal generator 216 may use CSD arithmetic to further improve the speed performance.

Figure 3:
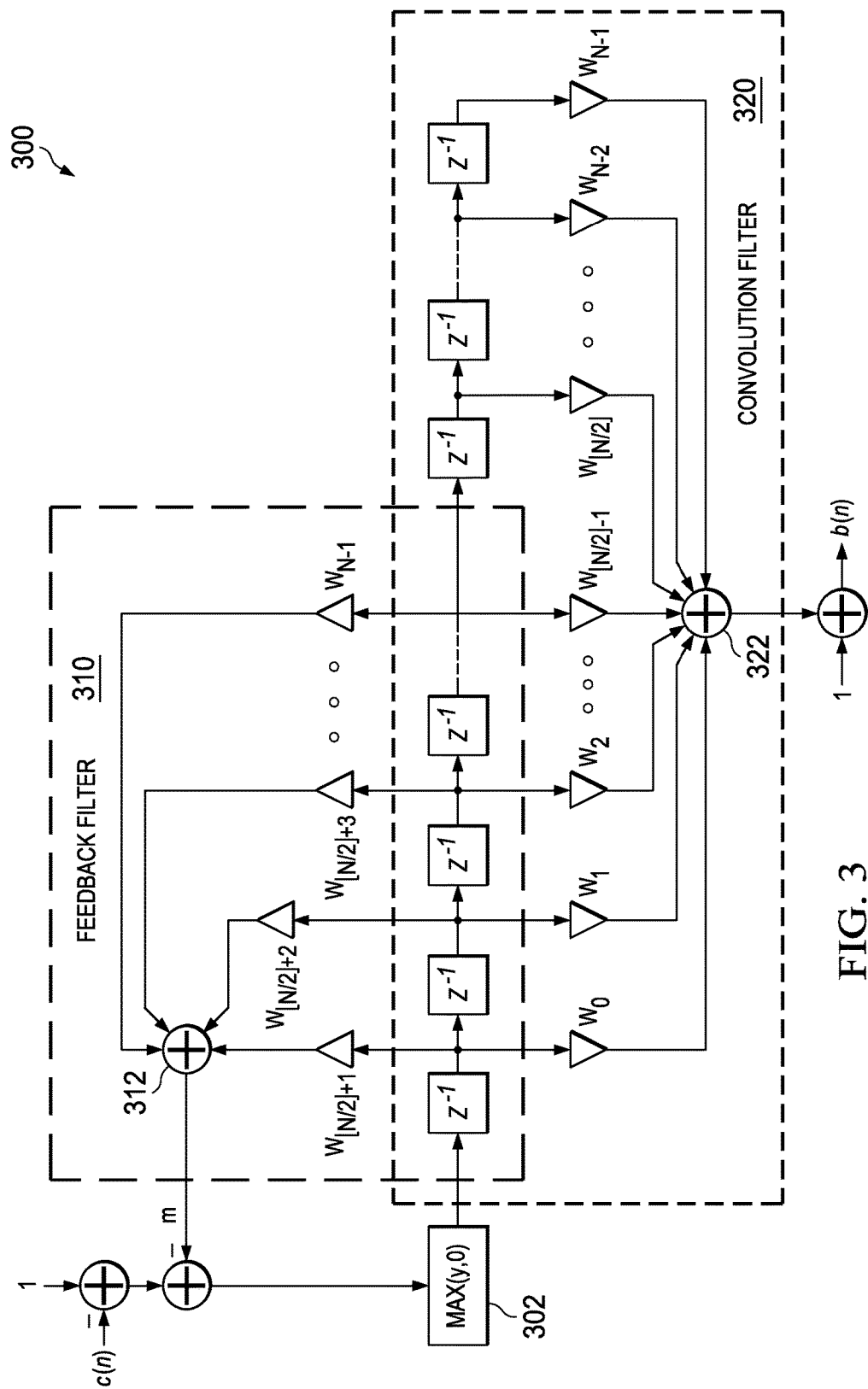
FIG. 3 is a schematic diagram illustrating an example windowing signal generator using a direct form FIR filter according to an implementation.

In some cases, to reduce the over-reduction issues discussed previously, a windowing signal generator may use a feedback signal to generate the windowing signal. For example, the windowing signal generator may include a feedback function unit. The feedback function unit may generate a feedback signal based on the outputs of half of the windowing function units. The feedback signal may be combined with the input signal in generating the windowing signal. FIG. 3 is a schematic diagram illustrating an example windowing signal generator 300 using a direct form FIR filter according to an implementation.

As illustrated in FIG. 3, the windowing signal generator 300 receives an input signal c(n) and generates a feedback signal m using a feedback filter 310. The windowing signal generator 300 generates a windowing signal b(n) based on the feedback signal m and the input signal c(n) using a convolutional filter 320, where $$b(n) = 1 - \sum_{k=-\infty}^{\infty} [1 - c(n)](n-k).$$

The windowing signal generator 300 also includes N delay taps. Each delay tap is shown as $Z^{-1}$ in FIG. 3.

In the illustrated example, N represents the order of the windowing signal generator 300. As illustrated, the feedback filter 310 includes N/2 windowing function units (shown as)

$$w_{\lfloor \frac{N}{2}+1 \rfloor}, w_{\lfloor \frac{N}{2}+2 \rfloor}, \cdots, w_{\lfloor N-1 \rfloor})$$

and N/2 delay taps (shown as $Z^{-1}$). In some cases, each of the windowing function units may be implemented as a multiplier that multiplies a signal with a windowing function coefficient. As illustrated, the windowing function coefficients for the N/2 windowing functions units in the feedback filter 310 can be expressed as $$w_{\lfloor \frac{N}{2}+1 \rfloor}, w_{\lfloor \frac{N}{2}+2 \rfloor}, \cdots, w_{\lfloor N-1 \rfloor},$$

where $\lfloor x \rfloor$ represents a floor operation. In operation, each of the windowing function units receives a delayed signal from a corresponding delay tap and multiplies its windowing coefficient with the delayed signal to generate a multiplied signal. The multiplied signals outputted from the windowing function units in the feedback filter 310 are summed to generate the feedback signal m.

As illustrated, the convolutional filter 320 includes N windowing function units and N delay taps. In some cases, as illustrated, the convolutional filter 320 and the feedback filter 310 share the N/2 delay taps in the feedback filter 310. The windowing function coefficients for the N windowing functions units in the convolutional filter 320 can be expressed as $W_0, W_1, W_2, \ldots, W W_{N-1}$. In operation, the input signal c(n) is multiplied by −1 and added to 1 to generate a signal 1−c(n). The feedback signal m is multiplied by −1 and added to the signal 1−c(n) to generate an input signal to the comparator 302. In some cases, e.g., when the input signal to the comparator 302 is greater than 0, the comparator 302 outputs the input a signal that it receives. In other cases, e.g., when the input signal is less than 0, the comparator 302 outputs 0. The output signal of the comparator 302 is passed to the N delay taps in sequence in the convolutional filter 320. Each of the windowing function units in the convolutional filter 320 receives a delayed signal from a corresponding delay tap and multiplies its windowing coefficient with the delayed signal to generate a multiplied signal. The multiplied signals outputted from the windowing function units in the convolutional filter 320 are summed to generate a forward signal. 1 is added to the forward signal to generate the windowing signal b(n).

In some cases, the processing speed of a windowing signal generator may be limited by the critical path and the latency. The critical path can be the path that may take the longest computation time. For example, the critical path of the windowing signal generator 300 increases as the number of delay taps increases, which corresponds to the order of the FIR filter. Therefore, the processing time of a high order direct form FIR filter may be longer than the sampling time of a broadband signal. Consequently, a high order direct form FIR filter may not be suitable for processing the broadband signal.

In some cases, the addition functions in the windowing signal generator 300 may create a bottleneck for high-speed performance. The windowing signal generator 300 includes two addition function units 312 and 322 that sum a large number of signals. The addition function unit 322 is included in the convolutional filter 320 and sums the multiplied signals in the forward path to generate the forward signal. In some cases, this addition function can be implemented using a pipeline structure. In some cases, a pipelining structure may be used to enable different functional units of a system to run concurrently. For example, in a structure that includes multiple functional units, extra pipeline registers may be introduced to partition the system into multiple stages. The data produced in one stage can be stored in the pipeline registers and delayed one clock cycle before being passed to the next stage. While pipelining may introduce latencies, this approach may increase the system throughput and enables the system to process at high speed.

The addition function unit 312 is included in the feedback filter 310 and sums the multiplied signals in the feedback path to generate the feedback signal. In contrast to the addition function unit in the convolutional filter 320, this addition function unit may not be pipelined. The latencies introduced by pipelining in the feedback filter 310 may change the functionality of the convolution function and degrade the performance of the windowing signal generator 300. Therefore, the speed performance of the windowing signal generator 300 may be limited by the delay of the generation of the feedback signal.

Figure 4:
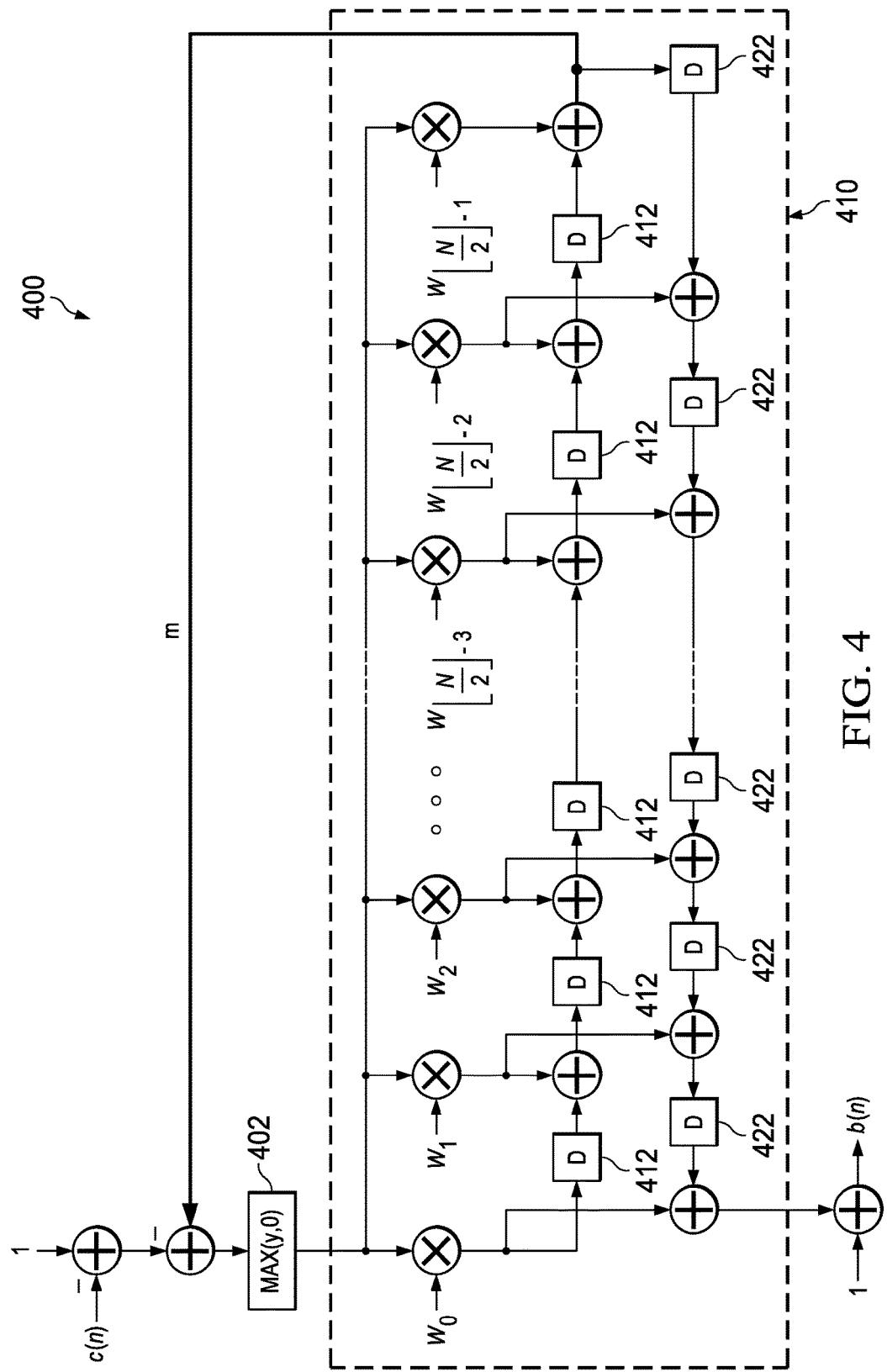
FIG. 4 is a schematic diagram illustrating an example windowing signal generator using a data broadcasting finite impulse response (FIR) filter according to an implementation.

FIG. 4 is a schematic diagram illustrating an example windowing signal generator 400 using a data broadcasting FIR filter according to an implementation. As illustrated in FIG. 4, the windowing signal generator 400 receives an input signal c(n) and generates a windowing signal b(n) using a data broadcasting filter 410, where $$b(n) = 1 - \sum_{k=-\infty}^{\infty} [1 - c(n)]w(n-k).$$

The data broadcasting filter 410 generates both the feedback signal m and the windowing signal b(n).

As illustrated, the windowing signal generator 400 includes a comparator 402 that is configured to compare the input signals. In operation, the input signal c(n) is multiplied by −1, and added to 1 to generate a signal 1−c(n). A feedback signal m is multiplied by −1 and added to the signal 1−c(n) to generate an input signal to a comparator 402. The comparator 402 outputs a signal that is either the input signal or 0.

In the illustrated example, N represents the order of the windowing signal generator 400. As illustrated, the data broadcasting filter 410 includes N/2 windowing function units. In some cases, each of the windowing function units may be implemented as a multiplier that multiplies a signal with a windowing function coefficient. The windowing function coefficients for the N/2 windowing functions units in the data broadcasting filter 410 can be expressed as $$w_0, w_1, w_2, \cdots, w_{\lfloor \frac{N}{2} \rfloor - 1}.$$

Figure 5:
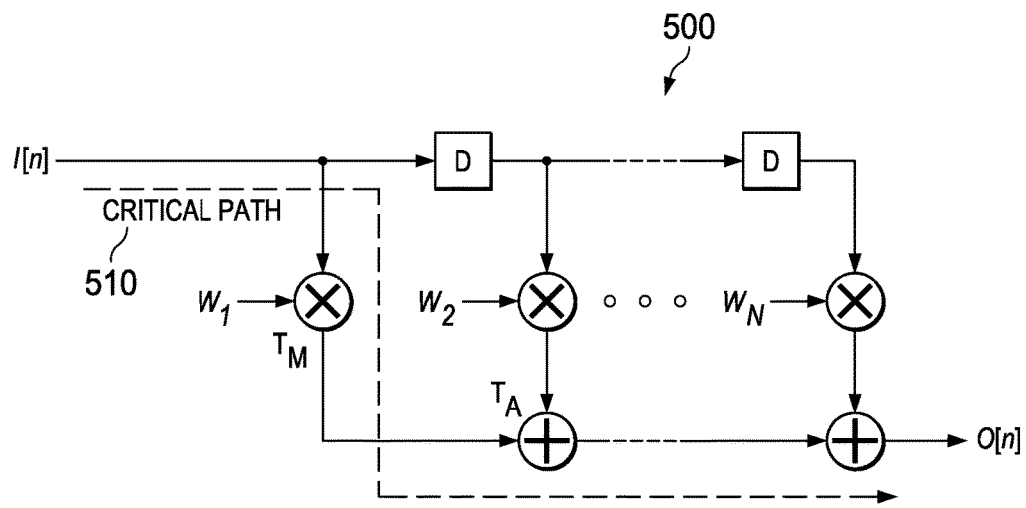
FIG. 5 is a schematic diagram illustrating a critical path in an example direct form FIR filter according to an implementation.
Figure 6:
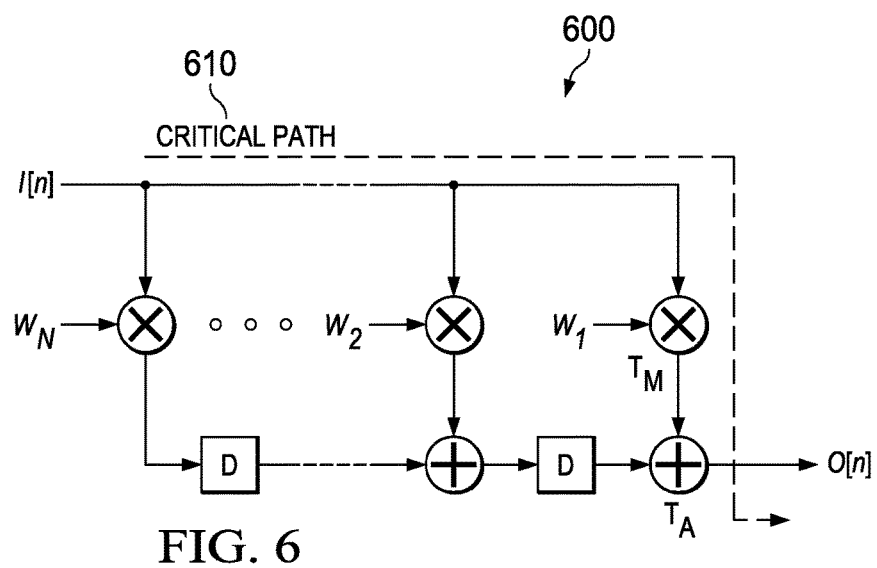
FIG. 6 is a schematic diagram illustrating a critical path in a data broadcasting FIR filter according to an implementation.

In operation, each of the windowing function unit receives a signal outputted from the comparator 402 and transposes the signal into a transposed signal. In some cases, the windowing function unit may transpose the signal by multiplying the signal with its windowing coefficient. As illustrated, the data broadcasting filter 410 also includes N delay taps. The transposed signals pass through half of the N delay taps to generate the feedback signal m. Using a transposed structure reduces the delay created in the feedback path because the critical path remains the same while the number of delay taps increases. FIGS. 5-6 and associated descriptions provide details of the critical path. Therefore, this approach increases the speed performance of the windowing signal generator 400 and enables the windowing signal generator 400 to process signals with a high sampling rate.

As illustrated, the data broadcasting filter 410 includes N delay taps. As discussed above, the first half of the delay taps are used to generate the feedback signal m, while both the first and the second half of the delay taps are used to generate the forward signal. As illustrated, the data broadcasting filter 410 uses a folding structure. In operation, the transposed signals traverse through the first N/2 delay taps 412 to generate the feedback signal m, and then traverse through the second N/2 delay taps 422 in reverse order to generate the forward signal.

For example, a first windowing function unit $W_0$ generates a first transposed signal. The first transposed signal passes through a first delay tap and is added to a second transposed signal that is generated by a second windowing function unit $W_1$. The process repeats until the first N/2 delay taps are passed and N/2 transposed signals are added to generate the feedback signal m, which is fed into the comparator 402 as discussed above. In addition, the feedback signal m passes through a delay tap, adds the transposed signal that is generated by the windowing function unit $$W_{\lfloor \frac{N}{2} \rfloor - 2},$$

passes through another delay tap, and adds the transposed signal that is generated by the windowing function unit $$W_{\lfloor \frac{N}{2} \rfloor - 3}.$$

The process repeats until N/2 delay taps are passed and the first transposed signal that is generated by the first windowing function unit $W_0$ is added to generate the forward signal. The forward signal is multiplied by −1 and added to 1 to generate the windowing signal b(n).

Using the folding structure reduces the number of multiplication units, and therefore reduces the implementation complexities of the windowing signal generator 400. FIG. 7 and associated descriptions provide additional details of an example folding structure.

Figure 8:
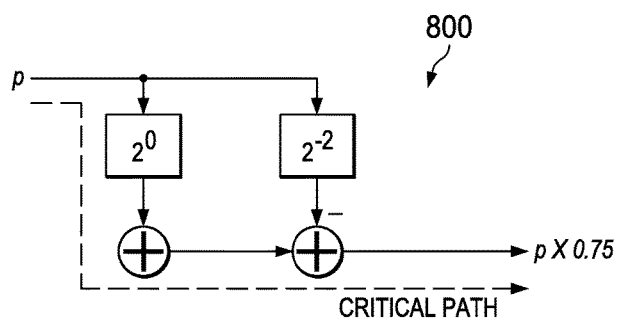
FIG. 8 is a schematic diagram illustrating an example canonic signed digit (CSD)-encoded multiplier according to an implementation.

In some cases, CSD may be used to implement the multiplying function of the windowing function units. Using CSD may reduce the cost and increase the speed performance of the windowing signal generator 400. FIG. 8 and associated descriptions provide additional details of CSD implementations.

FIG. 5 is a schematic diagram illustrating a critical path in an example direct form FIR filter 500 according to an implementation. As illustrated, the direct form FIR filter 500 includes N windowing function units. The windowing function coefficients for the N windowing functions units in the direct form FIR filter 500 can be expressed as $W_1$, $W_2$, ..., $W_N$. The direct form FIR filter 500 includes N−1 delay taps. In operation, the input signal I(n) traverses through the N−1 delay taps, and the output of each delay tap passes through a corresponding windowing function unit to generate a multiplied signal. The multiplied signals are added to generate the output signal O(n).

For example, the input signal I(n) passes through the first windowing function unit $W_1$ to generate a first multiplied signal. The input signal x(n) also passes through the first delay tap to generate a first delayed signal. The first delayed signal passes through the second windowing function unit $W_2$ to generate a second multiplied signal. The process repeats until N−1 delay taps are passed and N multiple signals are generated. The N multiple signals are added using N−1 addition function units to generate the output signal O(n).

Here, the critical path 510 of the direct form FIR filter 500 includes the first windowing function unit and the N−1 addition function units. Therefore, the speed performance of the direct form FIR filter 500 is limited by the number of additions. Assuming the processing time of each windowing function unit is $T_M$ and the processing time of each addition function unit is $T_A$, the processing time of the critical path $T_c$ is, therefore, greater than or equal to $T_M+(N-1)T_A$. As the number of the delay tap increases, the processing time of the critical path increases. Therefore, a high order filter with a large N may not be suitable to process signals with a short sampling time.

FIG. 6 is a schematic diagram illustrating a critical path in a data broadcasting FIR filter 600 according to an implementation. As illustrated, the data broadcasting FIR filter 600 includes N windowing function units. The windowing function coefficients for the N windowing functions units in the data broadcasting FIR filter 600 can be expressed as $W_1$, $W_2$, ..., $W_N$. The data broadcasting FIR filter 600 includes N−1 delay taps. In operation, the input signal I(n) are transposed into a plurality of transposed signal before passing through the N−1 delay taps and being added to generate the output signal O(n).

For example, the input signal I(n) passes through N windowing function units $W_1$, $W_2$, ..., $W_N$ to generate N transposed signals. The input signal I(n) passes through the first windowing function unit $W_N$ to generate the first transposed signal. The first transposed signal passes through a first delay tap and is added to the second transposed signal that is generated by second windowing function unit $W_{N-1}$. The process repeats until N−1 delay taps are passed and N transposed signals are added to generate the output signal O(n).

In some cases, a critical path may represent the path that corresponds to the maximum processing time inside a signal processing block. Therefore, the speed of a digital signal processing block may be determined by the critical path. Here, the critical path 610 of the data broadcasting FIR filter 600 includes the last windowing function unit and the last addition function unit. Therefore, the speed performance of the data broadcasting FIR filter 600 is not limited by the number of additions. Assuming the processing time of each windowing function unit is $T_M$ and the processing time of each addition function unit is $T_A$, the processing time of the critical path $T_c$ is, therefore, greater than or equal to $T_M+T_A$. As the number of the delay tap increases, the processing time of the critical path remains the same. Therefore, a high order filter with a large N may be used to process signals with a short sampling time and high sampling rate.

FIG. 7 is a schematic diagram 700 illustrating a folding transformation according to an implementation. The diagram 700 includes an example unfolded FIR filter 710 and an example folded FIR filter 720. The unfolded FIR filter 710 includes 6 windowing function units. The windowing function coefficients for the 6 windowing functions units in the unfolded FIR filter 710 can be expressed as h(5),h(4),h(3),h(2),h(1),h(0). The unfolded FIR filter 710 includes 5 delay taps. In operation, the input signal x(n) is transposed into 6 transposed signals using each of the 6 windowing function units. The transposed signals pass through the corresponding delay taps and are added to generate the output signal y(n).

For example, in the unfolded FIR filter 710, the input signal x(n) passes through 6 windowing function units h(5),h(4),h(3),h(2),h(1),h(0) to generate 6 transposed signals. The input signal x(n) passes through the first windowing function unit h(5) to generate the first transposed signal. The first transposed signal passes through a first delay tap and is added to the second transposed signal that is generated by the second windowing function unit h(4). The process repeats until 5 delay taps are passed and 6 transposed signals are added to generate the output signal y(n).

In the unfolded FIR filter 710, the windowing function units h(5),h(4),h(3),h(2),h(1),h(0) have a symmetric property. For example, the coefficient of the windowing function unit h(5) is equal to the coefficient of the windowing function unit h(0). Similarly, the coefficient of the windowing function unit h(4) is equal to the coefficient of the windowing function unit h(1), and the coefficient of the windowing function unit h(3) is equal to the coefficient of the windowing function unit h(2). Therefore, a folding structure can be used to reduce the number of windowing function units.

The folded FIR filter 720 includes 3 windowing function units. The windowing function coefficients for the 6 windowing functions units in the folded FIR filter 720 can be expressed as h(5),h(4),h(3). The folded FIR filter 720 includes 5 delay taps. In operation, the input signal x(n) is transposed into 3 transposed signals. The transposed signals traverse through 2 delay taps to generate a feedback signal, and then traverse through the 3 delay taps in reverse order to generate the output signal y(n).

For example, in the folded FIR filter 720, the input signal x(n) passes through 3 windowing function units h(5),h(4), h(3) to generate 3 transposed signals. A first windowing function unit h(5) generates a first transposed signal. The first transposed signal passes through a first delay tap and is added to a second transposed signal that is generated by a second windowing function unit h(4). The process repeats until the 2 delay taps are passed and 3 transposed signals are added to generate a feedback signal. The feedback signal m passes through a delay tap, adds the transposed signal that is generated by the windowing function unit h(3), passes through another delay tap, and adds the transposed signal that is generated by the windowing function unit h(4). The process repeats until 3 delay taps are passed and the first transposed signal is added to generate the output signal y(n).

The unfolded FIR filter 710 may have the same processing time as the folded FIR filter 720, while the folded FIR filter 720 achieves a 50% reduction of windowing function units.

As discussed above, the windowing function units may be implemented using multipliers that multiply an input signal with a windowing function coefficient. In some cases, the multiplier can be implemented using a multiplication function unit that directly carries out the multiplying operation. However, the multiplication operation may use a large number of resources and consume a significant power and processing time.

In some cases, the coefficients of the windowing function units in the windowing signal generator discussed previously may be constant. In these or other cases, the multipliers can be implemented using CSD arithmetic. The CSD arithmetic replaces the multiplication operation with additions and substrations. Therefore, the multipliers may be implemented using shifting registers, adders, and subtractors. Using CSD-encoded multipliers may save resources and reduce power consumption and processing time. FIG. 8 is a schematic diagram illustrating an example CSD-encoded multiplier 800 according to an implementation.

In an example, a constant multiplication A×P, can be expressed as $$A \times P = \sum_{i=0}^{W-1} a_{W-1-i} P \cdot 2^{-i},$$

where P is a variable, $A = a_{W-1}, a_{W-2} \ldots a_1 a_0$ and each $a_i (W-1 \geq i \geq 0)$ is in the set $\{-1, 0, 1\}$. For example, using CSD representation, $0.75 = 1.0\bar{1}$. Therefore, $P \times 0.75 = P \times 1.0\bar{1} = P \cdot (2^0 - 2^{-2})$.

Accordingly, the multiplier 800 includes 2 shift registers $2^0$ and $2^{-2}$, 1 adder and 1 subtractor. The input signal p passes through the shift register $2^0$ and the adder, and subtracts the input signal p that passes through the shift register $2^{-2}$ to generate an output signal p×0.75.

As illustrated, the critical path of the multiplier 800 includes 2 adders. Assuming the processing time of each multiplication operation is $T_M$ and the processing time of each addition function is $T_A$, the processing time of the critical path $T_c$ is, therefore, greater than or equal to $2 T_A$. In some cases, $2 T_A$ is less than $T_M$. Therefore, using the CSD-encoded multipliers may process signals with short sampling time and high sampling frequency.

Figure 9:
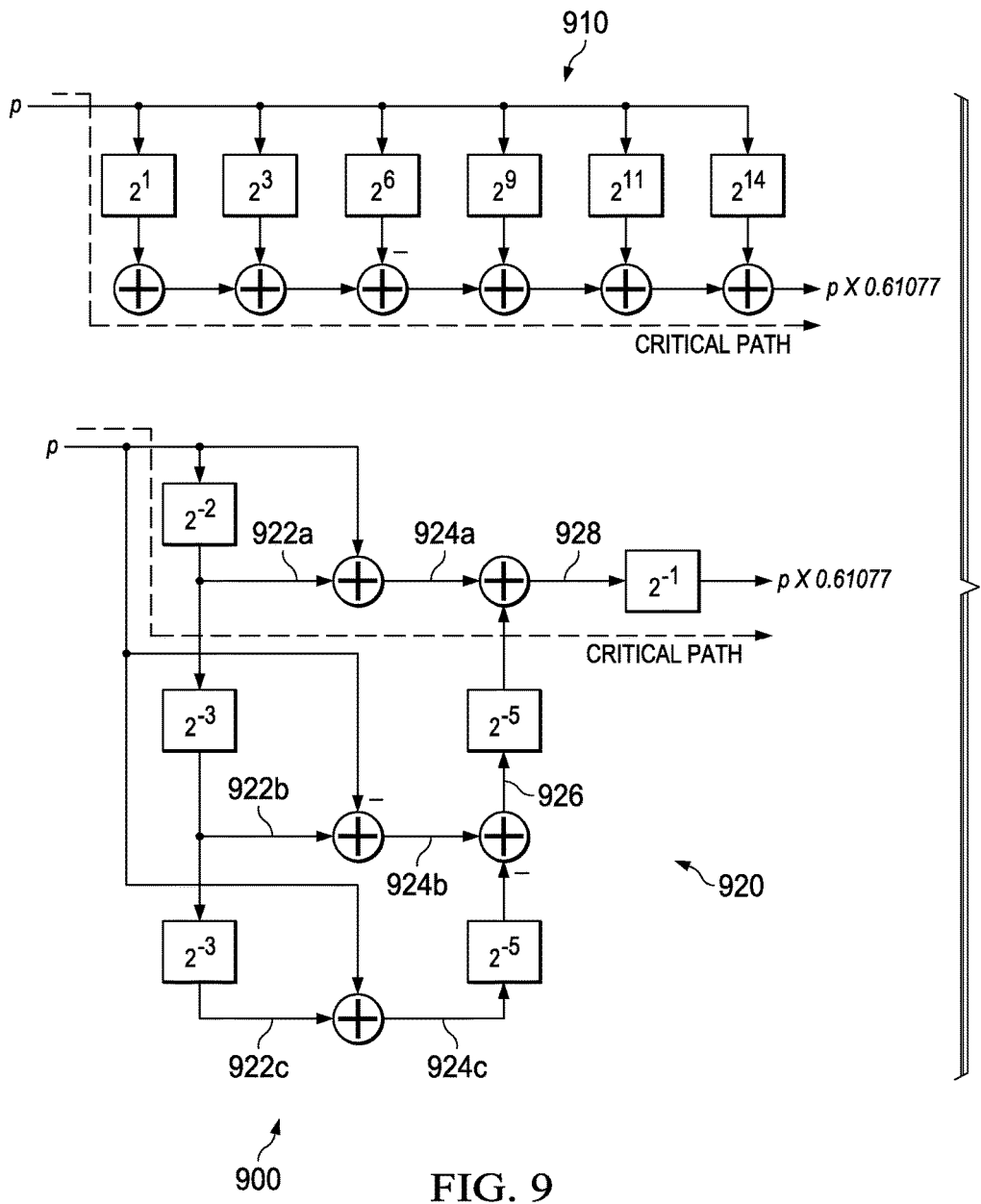
FIG. 9 is a schematic diagram illustrating optimized CSD arithmetic according to an implementation.

FIG. 9 is a schematic diagram 900 illustrating optimized CSD arithmetic according to an implementation. The schematic diagram 900 includes a CSD-encoded multiplier 910 that carries out a multiplying function of p×0.61077.

Using CSD representation, $0.61077 = 0.1010\bar{1}001 0\bar{1}00\bar{1}$. Therefore, $p \times 0.61077 = x \times 0.1010\bar{1} 0010\bar{1}00\bar{1} = x \cdot (2^{-1} + 2^{-3} - 2^{-6} + 2^{-9} - 2^{-11} - 2^{-14})$.

Accordingly, the multiplier 910 includes 6 shift registers $2^{-1}, 2^{-3}, 2^{-6}, 2^{-9}, 2^{-11}$, and $2^{-14}$, 5 adders, and 1 subtractor. In operation, the input signal p passes through each of the shift registers. The signals generated by the shift registers $2^{-1}, 2^{-3}, 2^{-9}, 2^{-11}$, and $2^{-14}$ are added using the 5 adders, and the signal generated by the shift registers $2^{-6}$ are subtracted using the subtractor to generate an output signal p×0.61077. Here, the processing time of the critical path $T_c$ is greater than or equal to $6 T_A$.

In some cases, the computation time of the CSD-encoded multiplier can be further reduced by using latency reduction algorithms. In some cases, the latency reduction algorithm takes out the common factors in the shift registers and arranges the CSD arithmetic in multi-stage operations. The schematic diagram 900 includes an optimized CSD-encoded multiplier 920 using the latency reduction algorithm to carry out a multiplying function of p×0.61077. Using multi-stage operations, the multiplying function can be represented in the following equation.

$$p \times 0.61077 = p \times 0.10100\bar{1}0010\bar{1}00\bar{1}$$
$$= p \cdot (2^{-1} + 2^{-3} - 2^{-6} + 2^{-9} - 2^{-11} - 2^{14})$$
$$= p \cdot 2^{-1}(1 + 2^{-2} - 2^{-5} + 2^{-8} - 2^{-10} - 2^{-13})$$
$$= p \cdot 2^{-1}((1 + 2^{-2}) + 2^{-5}((-1 + 2^{-3}) - 2^{-5}(1 + 2^{-3})))$$

Accordingly, the multiplier 920 includes 6 shift registers $2^{-2}$, $2^{-3}$, $2^{-3}$, $2^{-5}$, $2^{-5}$, and $2^{-1}$, 3 adders, and 2 subtractor. In operation, the input signal p passes through the shift registers $2^{-2}$, $2^{-3}$, $2^{-3}$ to generate the shift signals 922a-c, respectively. As illustrated, each of the shift signals 922a and 922c passes through an adder to add to the input signal p to generate intermediate signals 924a and 924c, respectively. The shift signal 922b passes through a subtractor to subtract the input signal p to generate an intermediate signal 924b. The intermediate signal 924b passes through a shift register $2^{-5}$ and is subtracted from the intermediate signal 924b to generate a second intermediate signal 926. The second intermediate signal 926 passes through another shift register $2^{-5}$ and is added to the intermediate signal 924a to generate a combined signal 928. The combined signal 928 passes through a shift register $2^{-1}$ to generate the output p×0.61077.

The critical path of the optimized CSD-encoded multiplier 920 includes 2 adders, and therefore the processing time of the critical path $T_c$ is greater than or equal to $2 T_A$, which is reduced significantly from the processing time of the multiplier 910.

Figure 10:
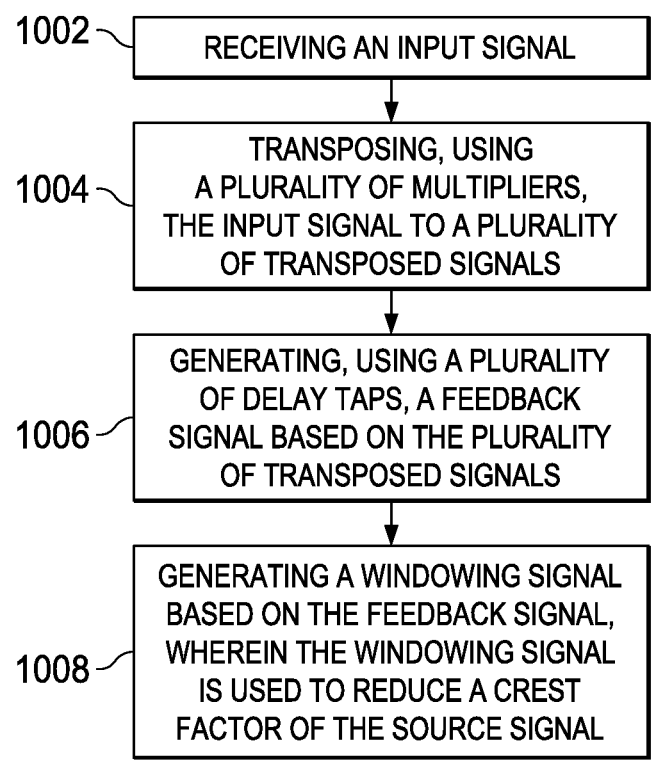
FIG. 10 is a flow chart illustrating an example method for reducing crest factors.

FIG. 10 is a flow chart illustrating an example method 1000 for reducing crest factors. In some cases, the example method 1000 can be implemented by a windowing signal generator. The method 1000 may begin at block 1002, where an input signal is received.

At block 1004, the input signal is transposed to a plurality of transposed signals using a plurality of multipliers. In some cases, each of the plurality of multipliers has a windowing function coefficient, and each of the plurality of transposed signals is generated by multiplying the input signal with the respective windowing function coefficient of each of the plurality of the multipliers. In some cases, at least one of the plurality of multipliers is implemented using canonic signed digit arithmetic. In some cases, at least one of the plurality of multipliers is implemented using a multiplication function unit.

At block 1006, a feedback signal is generated based on the plurality of transposed signals using a first plurality of delay taps. At block 1008, a windowing signal is generated based on the feedback signal. The windowing signal reduces a crest factor of the source signal. In some cases, a forward path signal is generated using the plurality of transposed signals, the first plurality of delay taps, and a second plurality of delay taps. In some cases, the windowing signal is generated based on the forward path signal. In some cases, an output signal is generated based on the windowing signal and the source signal.

While this specification contains many specific implementation details, these should not be construed as limitations on the scope of any invention or on the scope of what may be claimed, but rather as descriptions of features that may be specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation and/or integration of various system modules and components in the implementations described above should not be understood as requiring such separation and/or integration in all implementations, and it should be understood that the described program components and systems can generally be integrated together in a single software product or packaged into multiple software products. Furthermore, while the operations depicted in the drawings may indicate start and/or end points for the operations, implementations of the methods described in the disclosure are not restricted to the particular start and/or end point as illustrated. Other implementations may start and/or end at different points of the operations.

Particular implementations of the subject matter have been described. Other implementations, alterations, and permutations of the described implementations are within the scope of the following claims as will be apparent to those skilled in the art. For example, the actions recited in the claims can be performed in a different order and still achieve desirable results.

Accordingly, the above description of example implementations does not define or constrain this disclosure. Other changes, substitutions, and alterations are also possible without departing from the spirit and scope of this disclosure.

What is claimed is:

1. A method for reducing crest factors, comprising:
   receiving an input signal;
   transposing, using a plurality of multipliers of a windowing signal generator with a folding structure including the plurality of multipliers, the input signal to a plurality of signals transposed without using delay taps;
   generating, using a first plurality of delay taps, a feedback signal based on the plurality of signals transposed without using delay taps, wherein the feedback signal comprises combination of at least one of the signals transposed without using delay taps and a delayed signal, the delayed signal is based on at least one of the plurality of the signals transposed without using delay taps;
   generating a windowing signal based on the feedback signal, wherein the windowing signal is used to reduce a crest factor of a source signal;
   generating an output signal based on the source signal and the windowing signal; and
   transmitting the output signal.

2. The method of claim 1, further comprising:
   generating a forward path signal using the plurality of signals transposed without using delay taps, the first plurality of delay taps, and a second plurality of delay taps.

3. The method of claim 2, wherein the windowing signal is generated based on the forward path signal.

4. The method of claim 1, wherein each of the plurality of multipliers has a windowing function coefficient, and each of the plurality of signals transposed without using delay taps is generated by multiplying the input signal with the respective windowing function coefficient of each of the plurality of the multipliers.

5. The method of claim 1, wherein at least one of the plurality of multipliers is implemented using canonic signed digit arithmetic.

6. The method of claim 1, wherein at least one of the plurality of multipliers is implemented using a multiplication function unit.

7. The method of claim 1, wherein the generation of the feedback signal comprises:
   delaying a first signal transposed without using a delay tap to get a first delayed transposed signal;
   summing the first delayed transposed signal to a second signal transposed without using a delay tap to get a first combined signal; and
   delaying the first combined signal.

8. The method of claim 1, wherein the generation of the windowing signal comprises:
   inverting the feedback signal by multiplying the feedback signal with −1;
   inverting the input signal by multiplying the input signal with −1;
   generating a modified input signal by adding the inverted input signal, 1, and the inverted feedback signal; and
   generating the windowing signal using the modified input signal.

9. A transmitter, comprising:
   an amplitude calculator comprising one or more hardware circuit elements, or comprising combination of one or more hardware circuit elements and software, wherein the amplitude calculator is configured to calculate an amplitude of a source signal;
   a clipping signal generator comprising one or more hardware circuit elements, or comprising combination of one or more hardware circuit elements and software, wherein the clipping signal generator is configured to generate a clipping signal based on the amplitude of the source signal and a predetermined clipping level;
   a windowing signal generator using a folding structure, the windowing signal generator configured to:
      transpose, using a plurality of multipliers, the clipping signal to a plurality of signals transposed without using delay taps, the folding structure including the plurality of multipliers;
      generate, using a first plurality of delay taps, a feedback signal based on the plurality of signals transposed without using delay taps, wherein the feedback signal comprises combination of at least one of the signals transposed without using delay taps and a delayed signal, the delayed signal is based on at least one of the plurality of the signals transposed without using delay taps;
      generate a windowing signal based on the feedback signal, wherein the windowing signal is used to reduce a crest factor of the source signal;
   a multiplier that is configured to generate an output signal based on the source signal and the windowing signal; and
   an antenna configured to transmit the output signal.

10. The transmitter of claim 9, wherein the windowing signal generator is further configured to generate a forward path signal using the plurality of signals transposed without using delay taps, the first plurality of delay taps, and a second plurality of delay taps.

11. The transmitter of claim 10, wherein the windowing signal is generated based on the forward path signal.

12. The transmitter of claim 9, wherein each of the plurality of multipliers has a windowing function coefficient, and each of the plurality of signals transposed without using delay taps is generated by multiplying an input signal with the respective windowing function coefficient of each of the plurality of the multipliers.

13. The transmitter of claim 9, wherein the generation of the feedback signal comprises:
   delaying a first signal transposed without using a delay tap to get a first delayed transposed signal;
   summing the first delayed transposed signal to a second signal transposed without using a delay tap to get a first combined signal; and
   delaying the first combined signal.

14. The transmitter of claim 9, wherein the generation of the windowing signal comprises:
   inverting the feedback signal by multiplying the feedback signal with −1;
   inverting an input signal by multiplying the input signal with −1;
   generating a modified input signal by adding the inverted input signal, 1, and the inverted feedback signal; and
   generating the windowing signal using the modified input signal.

15. A user device, comprising:
   an amplitude calculator comprising one or more hardware circuit elements, or comprising combination of one or more hardware circuit elements and software, wherein the amplitude calculator is configured to calculate an amplitude of a source signal;
   a clipping signal generator comprising one or more hardware circuit elements, or comprising combination of one or more hardware circuit elements and software, wherein the clipping signal generator is configured to generate a clipping signal based on the amplitude of the source signal and a predetermined clipping level;
   a windowing signal generator using a folding structure, the windowing signal generator configured to:
      transpose, using a plurality of multipliers, the clipping signal to a plurality of signals transposed without using a delay tap, the folding structure including the plurality of multipliers;
      generate, using a first plurality of delay taps, a feedback signal based on the plurality of signals transposed without using delay taps, wherein the feedback signal comprises combination of at least one of the signals transposed without using delay taps and a delayed signal, the delayed signal is based on at least one of the plurality of the signals transposed without using delay taps; and
      generate a windowing signal based on the feedback signal, wherein the windowing signal is used to reduce a crest factor of the source signal;
   a multiplier that is configured to generate an output signal based on the source signal and the windowing signal; and
   an antenna configured to transmit the output signal.

16. The user device of claim 15, wherein the windowing signal generator is further configured to generate a forward path signal using the plurality of signals transposed without using delay taps, the first plurality of delay taps, and a second plurality of delay taps.

17. The user device of claim 16, wherein the windowing signal is generated based on the forward path signal.

18. The user device of claim 15, wherein each of the plurality of multipliers has a windowing function coefficient, and each of the plurality of signals transposed without using delay taps is generated by multiplying an input signal with the respective windowing function coefficient of each of the plurality of the multipliers.

19. The user device of claim 15, wherein the generation of the feedback signal comprises:
   delaying a first signal transposed without using delay taps to get a first delayed transposed signal;
   summing the first delayed transposed signal to a second signal transposed without using a delay tap to get a first combined signal; and
   delaying the first combined signal.

20. The user device of claim 15, wherein the generation of the windowing signal comprises:
   inverting the feedback signal by multiplying the feedback signal with −1;
   inverting an input signal by multiplying the input signal with −1;
   generating a modified input signal by adding the inverted input signal, 1, and the inverted feedback signal; and
   generating the windowing signal using the modified input signal.

\* \* \* \* \*